(12) United States Patent
Uraki et al.

(10) Patent No.: US 8,092,706 B2
(45) Date of Patent: *Jan. 10, 2012

(54) PIEZOELECTRIC CERAMIC COMPOSITION

(75) Inventors: Shingo Uraki, Tokyo (JP); Ryo Suzuki, Kanagawa (JP); Takaaki Tsurumi, Kanagawa (JP)

(73) Assignee: Konica Minolta Holdings, Inc., Tokyo (JP)

( * ) Notice: Subject to any disclaimer, the term of this patent is extended or adjusted under 35 U.S.C. 154(b) by 665 days.

This patent is subject to a terminal disclaimer.

(21) Appl. No.: 12/280,451

(22) PCT Filed: Feb. 26, 2007

(86) PCT No.: PCT/JP2007/053500
§ 371 (c)(1), (2), (4) Date: Aug. 22, 2008

(87) PCT Pub. No.: WO2007/099901
PCT Pub. Date: Sep. 7, 2007

(65) Prior Publication Data
US 2009/0020726 A1   Jan. 22, 2009

(30) Foreign Application Priority Data

Feb. 28, 2006  (JP) .................................. 2006-052550
Sep. 8, 2006  (JP) .................................. 2006-243864

(51) Int. Cl.
*C04B 35/00* (2006.01)
*C04B 35/495* (2006.01)

(52) U.S. Cl. ............................ 252/62.9 PZ; 252/62.9 R

(58) Field of Classification Search ............. 252/62.9 R, 252/62.9 PZ; 310/323.11, 358; 117/937, 117/947, 948
See application file for complete search history.

(56) References Cited

U.S. PATENT DOCUMENTS

| 6,231,779 | B1 * | 5/2001 | Chiang et al. ............. 252/62.9 R |
| 7,845,768 | B2 * | 12/2010 | Uraki ............................. 347/69 |
| 7,905,579 | B2 * | 3/2011 | Uraki ............................. 347/69 |
| 2004/0058797 | A1 * | 3/2004 | Nonoyama et al. ............ 501/134 |
| 2006/0006360 | A1 * | 1/2006 | Takao et al. .............. 252/62.9 R |

FOREIGN PATENT DOCUMENTS

| JP | 11228225 | 8/1999 |
| JP | 11228228 | 8/1999 |
| JP | 2004244300 | 9/2004 |
| JP | 2004244301 | 9/2004 |
| JP | 2006028001 | 2/2006 |

* cited by examiner

*Primary Examiner* — Jerry Lorengo
*Assistant Examiner* — Lynne Edmondson
(74) *Attorney, Agent, or Firm* — Lucas & Mercanti, LLP

(57) ABSTRACT

Disclosed is a piezoelectric ceramic composition which is produced by adding two or more metal elements and has excellent piezoelectric properties. The piezoelectric composition comprises the main ingredient represented by the general formula: $[Li_x(K_{1-y}Na_y)_{1-x}](Nb_{1-z-w}Ta_zSb_w)O_3$ ($0 \leq x \leq 0.2$, $0 \leq y \leq 1$, $0 \leq z \leq 0.4$, $0 < w \leq 0.2$) and the auxiliary ingredient represented by the general formula: $ABO_3$ (wherein A and B independently represent a metal element having a valence of +3 or together represent a combination of at least two metal elements each having a valence of +3 in average; and $ABO_3$ represents a compound having a perovskite structure).

2 Claims, 1 Drawing Sheet

ONLY MAIN INGREDIENT

ADDITION OF 0.6 mol % OF $BiFeO_3$

PIEZOELECTRIC CERAMIC COMPOSITION

TECHNICAL FIELD

The present invention relates to a piezoelectric ceramic composition, and particularly relates to a piezoelectric ceramic composition containing no lead.

BACKGROUND

Heretofore, a PZT ($PhTiO_3$—$PbZrO_3$) constituent-based ceramic containing lead has been used in a piezoelectric ceramic composition. The reason for it is that the aforesaid PZT, exhibiting excellent piezoelectric properties and a high mechanical quality coefficient, can readily produce materials exhibiting various desired characteristics which are required for various applications such as a sensor, an actuator, and a filter. Further, since the PZT has a high relative dielectric constant, it may also be used as a capacitor.

However, while the piezoelectric ceramic composition composed of the aforesaid PZT exhibits excellent characteristics, it contains lead as an element constituting the composition, leading to a concern that harmful lead is liquated from industrial waste of products containing PZT to result in an environmental pollution. The increasing awareness of environmental concern in recent years has made it difficult to manufacture the products containing substances such as PZT which have been a cause of environmental pollution. To cope with the above problem, piezoelectric ceramic compositions have been developed which include no lead in their compositions and whose main component is a chemical compound which is represented by formula $\{Li_x(K_{1-y}Na_y)_{1-x}\}(Nb_{1-z-w}Ta_zSb_w)O_3$, wherein x, y, z and w are within the ranges of $0=x=0.2$, $0=y=1$, $0<z=0.4$, and $0<w=0.2$, respectively (refer to Patent Document 1).

Technologies have been known in which at least one of any of metal elements selected from a group including Ag, Al, Au, B, Ba, Bi, Ca, Ce, Co, Cs, Cu, Dy, Er, Eu, Fe, Ga, Gd, Ge, Hf, Ho, In, Ir, La, Lu, Mg, Mn, Nd, Ni, Pd, Pr, Pt, Rb, Re, Ru, Sc, Si, Sm, Sn, Sr, Tb, Ti, Tm, V, Y, Yb, Zn, and Zr is added in an amount of 0.0005-0.15 mol/mol of the above-described main component in the piezoelectric ceramic composition in which the main component exhibits a perovskite structure of $ABO_3$ type (refer to Patent Documents 2 and 3).

Patent Document 1: Japanese Patent Application Publication (hereinafter also referred to as JP-A) No. 2004-300012
Patent Document 2: JP-A No. 2004-244301
Patent Document 3: JP-A No. 2004-244300

DISCLOSURE OF THE INVENTION

Issues to be Solved by the Invention

However, there has been a problem that addition of only one metal element which is described in Patent Documents 2 and 3 did not sufficiently improve the targeted characteristics. Further, though addition of more than or equal to one metal elements may also be considered, there was also a problem in that specific preferable combinations or effects thereof were not clearly described.

The present invention has been achieved in consideration of such problems, and it is an object of the present invention to provide a piezoelectric ceramic composition exhibiting excellent piezoelectric properties which can be attained by addition of not less than two metal elements.

(1) To solve the above-mentioned issues, the invention is characterized in that a piezoelectric ceramic composition incorporates a main ingredient represented by a Formula 1 and an auxiliary ingredient represented by a Formula 2.

$$\{Li_x(K_{1-y}Na_y)_{1-x}\}(Nb_{1-z-w}Ta_zSb_w)O_3 \qquad \text{Formula 1}$$

wherein $0 \leq X \leq 0.2$, $0 \leq Y \leq 1$, $0 < Z \leq 0.4$, and $0 < W \leq 0.2$,
Formula 2: $ABO_3$,
wherein A represents a metal element having a valence of +3 or a combination of metal elements having a valence of +3 on average, and B represents a metal element having a valence of +3 or a combination of metal elements having a valence of +3 on average, and $ABO_3$ represents a compound having a perovskite structure.

(2) According to the invention described in Item 1, above, since at least two metal elements are added in such a combination that they have a perovskite structure represented by $ABO_3$, the present invention is effective in improving piezoelectric properties and dielectric properties.

(3) The invention described in Item 2, above, is a piezoelectric ceramic composition of claim 1, wherein A in Formula 2 comprises Bi.

(4) The invention described in Item 3, above, is a piezoelectric ceramic composition of claim 1 or 2, wherein B in Formula 2 comprises at least one of Fe, In, Sc, Y, and Mn.

EFFECTS OF THE INVENTION

According to the present invention, addition of a sub-component represented by $ABO_3$ (wherein A contains Bi, and B contains at least one of Fe, In, Sc, Y, and Mn) increases the relative dielectric constant as well as a degree of polarization of the resulting piezoelectric ceramic composition, to further result in a piezoelectric ceramic composition exhibiting excellent piezoelectric properties.

DESCRIPTION OF THE PREFERRED EMBODIMENTS

Figure 1:
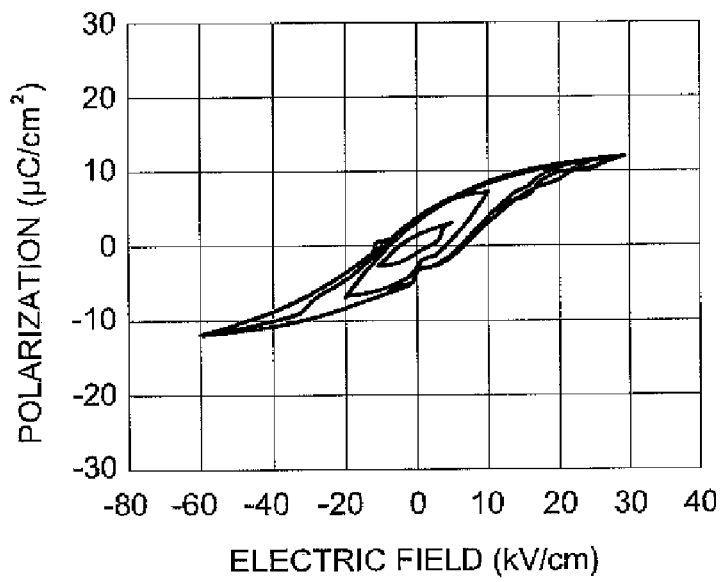
FIG. 1(*a*) shows hysteresis loops of a piezoelectric ceramic composition composed of only one main component, while FIG. 1(*b*) shows hysteresis loops of a piezoelectric ceramic composition of the present embodiment in which a sub-component has been added.
Figure 1:
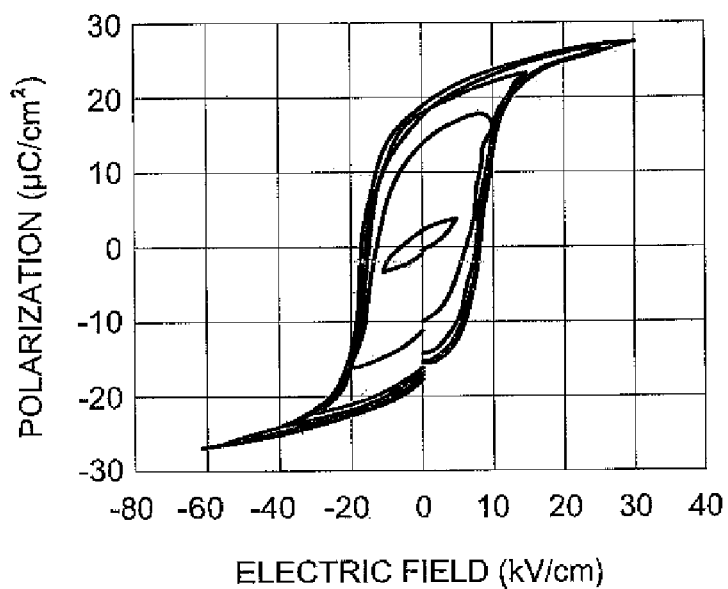

An embodiment of the piezoelectric ceramic composition of the present invention will now be described.

The piezoelectric ceramic composition of the present embodiment is characterized in that it incorporates a main component which is represented by formula $\{Li_X(K_{1-Y}Na_Y)_{1-X}\}(Nb_{1-Z-W}Ta_ZSb_W)O_3$, wherein x, y, z and w are within the ranges of $0=X=0.2$, $0=y=1$, $0<z=0.4$, and $0<w=0.2$, respectively, and a sub-component which is represented by $ABO_3$ (wherein A contains Bi, and B contains at least one of Fe, In, Sc, Y, and Mn).

Hereinafter, each component will be described.

The main component of the present embodiment is represented by formula $\{Li_X(K_{1-Y}Na_Y)_{1-X}\}(Nb_{1-Z-W}Ta_ZSb_W)O_3$. In the case of x>0.2, z>0.4, w>0.2, z=0, or w=0, piezoelectric properties such as a piezoelectric $d_{31}$-constant and dielectric properties decrease, to result in concerns that a piezoelectric ceramic composition exhibiting desired properties may not be obtained.

Such a main component can be provided by preparing raw materials containing each metal element as the raw material, and then the materials being sufficiently blended by, for example, a ball mill. Raw materials for the main component include, for example, $Li_2CO_3$, $Li_2O$, $LiNO_3$, and LiOH as a Li containing compound; $Na_2CO_3$, $NaHCO_3$, and $NaNO_3$ as a Na containing compound; $K_2CO_3$, $KNO_3$, $KNbO_3$, and $KTaO_3$ as a K containing compound; $Nb_2O_5$, $Nb_2O_3$, and $NbO_2$ as a Nb containing compound; $Ta_2O_5$ as a Ta containing compound; and $Sb_2O_5$, $Sb_2O_3$, and $Sb_2O_4$ as a Sb containing compound.

The main component features a perovskite structure ($ABO_3$), and elemental constitution of the A site corresponds to K and Na or K, Na, and Li, and elemental constitution of the B site corresponds to Nb, Ta, and Sb. A composition of the perovskite structure becomes a perfect perovskite structure when the stoichiometric ratio between atoms constituting the A site and atoms constituting the B site is 1:1. But in the case of a piezoelectric ceramic composition, it may happen that, in particular, several percent of the amount of K, Na, Li or Sb volatilize during the calcination step, or all constituting elements vary in several percent during the production steps such as a mixing pulverization step or a granulation step. In other words, deviation from a stoichiometric composition is possible due to variation in production.

In response to such a variation in the composition, an intentional alteration of the ratio of composition of compounded material enables the ratio of the composition of the sintered piezoelectric ceramic composition to vary by ±several percent, specifically by ±3-5%. A similar alteration may be done to, for example, the conventional lead zirconium titanate (PZT), and the compounding ratio may be regulated in consideration of vaporization of lead during sintering or incorporation of zirconia from zirconia balls which is a pulverization medium.

In the piezoelectric ceramic composition incorporating the main component of the present embodiment, electrical characteristics such as piezoelectric properties do not vary largely, even if the ratio of composition of compounded material is intentionally altered in such a way as mentioned above. Therefore, in the present invention, when the main components are fitted to the composition formula $ABO_3$ of a perovskite structure, the constitution ratio of metal elements at the A and B sites can deviate from 1:1 by as much as about ±5 mol % for each site. In order to achieve high electrical characteristics by allowing the amount of lattice defects in a constituted crystal to be reduced, the amount of the deviation of the constitution ratio of the composition is preferably about ±3%. That is, in the constitution represented by formula $\{Li_x(K_{1-y}Na_y)_{1-x}\}(Nb_{1-z-w}Ta_zSb_w)O_3$, the main components are $0.95 \leq a \leq 1.05$ and $0.95 \leq b \leq 1.05$, preferably $0.97 \leq a \leq 1.03$ and $0.97 \leq b \leq 1.03$.

In the main components represented by the above formula, $0 < x \leq 0.2$ is preferable. In this case, since Li is included as an essential component, the calcination of the resulting piezoelectric ceramic composition can be more readily carried out, and at the same time, the piezoelectric properties thereof can be enhanced and Curie temperature Tc can be further increased. The reason for it is that by allowing the Li to be the essential component within the aforesaid range, the sintering temperature can be decreased, and, at the same time, Li plays the role of a sintering additives whereby sintering to produce a less void substance can be achieved.

In the main components represented by the above formula, $x=0$ is allowed. In this case, the main component is represented by $(K_{1-y}Na_y)(Nb_{1-z-w}Ta_zSb_w)O_3$. Since the piezoelectric ceramic composition incorporating such a main component does not contain the lightest metal element of Li as a lithium compound, such as $LiCO_3$ in their raw materials, variation in properties due to segregation of raw material powder is allowed to be small, when the raw materials are blended to produce the aforesaid piezoelectric ceramic composition. In addition, a high relative dielectric constant $\in_r$ as well as a relatively large piezoelectric constant may be realized.

In order to further enhance piezoelectric constant and electromechanical coupling coefficient of the resulting piezoelectric ceramic composition, "y" is preferably in the range of $0 \leq y \leq 0.85$, more preferably in the range of $0.05 \leq y \leq 0.75$, further more preferably in the range of $0.3 \leq y \leq 0.65$, and yet further, "y" is most preferably in the range of $0.42 \leq y \leq 0.60$.

In the main components represented by the above formula, $y=0$ is viable. In which case, Na is not incorporated in the main component, which results in a decrease of dielectric loss and enhancement of long term stability of dielectric loss of the resulting piezoelectric ceramic composition.

In the main components represented by the above formula, $z+w \leq 0.37$ is preferable. In this case, piezoelectric properties such as piezoelectric constant are allowed to be further enhanced.

Next, a sub-component of the present embodiment will be described.

The sub-component of the present embodiment is represented by formula $ABO_3$, and is a perovskite compound of the $ABO_3$ type, wherein A represents a metal element having a valence of +3 or a combination of metal elements having a valence of +3 on average, and B represents a metal element having a valence of +3 or a combination of metal elements having a valence of +3 on average. It is preferable that the A in the sub-component contains element Bi, and the B contains at least one of elements of Fe, In, Sc, Y, and Mn. In order to produce a highly dense sintered substance during the sintering step of a piezoelectric ceramic composition, the amount of the sub-component to be added is preferably less than 1 mol % pet 100 mol % of the piezoelectric ceramic composition after the sub-component has been added.

The sub-component represented by the above formula may be added to the main component in the form of a compound constituting a perovskite compound of the $ABO_3$ type, or the sub-component may be added in the step where the sub-component is blended with the main component in the form of a combination of raw materials which will become an $ABO_3$ type perovskite compound. Compounds which constitute a perovskite structure include BiInO3, BiScO3, $BiFeO_3$, $BiMnO_3$, and $BiYO_3$. Raw materials which can become an $ABO_3$ type perovskite compound at the blending step include; $Bi_2O_3$ as a Bi containing compound; $In_2O_3$ as an In containing compound; $Sc_2O_3$ as a Sc containing compound; $Fe_2O_3$ as an Fe containing compound; $MnO_2$, $Mn_2O_3$, $Mn_2O_5$, $Mn_3O_4$, and $MnCO_3$ as a Mn containing compound; and $Y_2O_3$ as an Y containing compound. Highly pure raw materials of at least 99% are preferred.

The sub-component of the present invention is an $ABO_3$ type perovskite compound, and the metal elements which constitute the A site preferably contains Bi, and other metal elements include those having a valence of +3 such as La. Metal elements which constitute the B site include Fe, In, Sc, Ga, Dy, Er, Gd, Ho, Sm, Y, Yb, Al, Mn, and Cr. Metal elements which constitute the A and B sites of the sub-component are not limited to one metal element but may be a combination of at least two metal elements. For example, the constitution of the A site may be replaced by Bi or another metal element having a valence of +3 such as La, Ce, Nd, Gd, Pu, Fe or a combination of metal elements having an average valence of +3. A part of the constitution of the B site may be replaced by a metal element having a valence of +3 or a combination of metal elements having an average valence of +3. Further, raw materials of the sub-component may be compounded in a stoichiometric ratio of 1:1 between elements constituting the A site and elements constituting the B site to form $ABO_3$, or the stoichiometric ratio may be allowed to vary by ±several percent in consideration of variation during production such that the metal element such as Bi vaporizes during the sintering step.

Next, the production method of the piezoelectric ceramic composition of the present invention and the piezoelectric substance employing the piezoelectric ceramic composition will be described. The production method of the piezoelectric substance is not particularly limited, but the production method via a solid phase thermochemical reaction will be described.

First, raw materials of the main component are prepared and fully dried. The dried raw materials, the weight of each of which being in the stoichiometric ratio of $ABO_3$, are blended via a ball-mill, and then dried. Then, the resulting mixture is calcined at 800-1,000° C. to decompose and solidify the raw materials via a solid phase thermochemical reaction. The resulting calcined mixture is wet-milled into fine particles having a center of the particle size distribution of about 5 μm, and is dried to produce a calcined powder of the main component.

Next, raw materials of the sub-component are prepared and fully dried. The dried raw materials, the weight of each of which being in the stoichiometric ratio of $ABO_3$, are subjected to wet mixing to produce a mixed powder of the sub-component.

Subsequently, the calcined powder of the main component and the mixed powder of the sub-component are compounded so that "V" falls within the range of $0<V<0.01$ in formula $[\{Li_x(K_{1-y}Na_y)_{1-x}\}(Nb_{1-Z-W}Ta_ZSb_W)O_3]_{z-V}(ABO_3)_V$. The compounded material is fully blended via, for example, a ball-mill, and then dried to produce a blended substance. The resulting blended substance is calcined at 700-800° C., and then the calcined powder is pulverized. An organic bonding agent such as a binder is added to the pulverized substance, which is then granulated and subjected to a pressure molding. The aforesaid pressure molding is preferably carried out in such a manner that the granulated substance made of the above pulverized substance is molded into the form of pellets via uniaxial pressing, and then the resulting pellets are re-molded via a cold isostatic press.

The compact thus obtained are sintered at 1,000-1,300° C. to produce a sintered product. The resulted sintered product is cut to a predetermined size, which is then subjected to a parallel grinding to form electrodes via sputtering on both sides thereof. Subsequently, in silicone oil of 80-150° C., direct current voltage of 1-6 kv/mm is applied between the electrodes to polarize them in the thickness direction to produce a piezoelectric substance.

As stated above, according to the piezoelectric ceramic composition of the present embodiment, addition of at least two metal elements as an sub-component in a combination represented by $ABO_3$ (where the A site contains Bi, and the B site contains at least one of Fe, In, Sc, Y, and Mn) having a perovskite structure, significantly increases remanent polarization of the resulting piezoelectric ceramic composition, to result in improved piezoelectric properties. The reason for such improvement is considered to be that when Bi is added in a form of $Bi_2O_3$ alone, the valence of Bi becomes +5, and the B site tends to be replaced by the Bi, while when Bi is added in a form of a combination of $ABO_3$ (for example, $BiFeO_3$) which is known to have a perovskite structure, the valence of Bi becomes +3, and the A site tends to be replaced by the Bi.

A piezoelectric substance employing a piezoelectric ceramic composition having a large remanent polarization such as shown in the present embodiment is also usable as a memory element. For example, the aforesaid piezoelectric substance is also usable as a memory device by applying voltage individually on a plurality of arranged piezoelectric elements. Specifically, the aforesaid piezoelectric substance is usable as a rewritable memory in such a manner that writing is conducted by supplying a drive signal in accordance with information to be recorded, and reading is conducted upon detecting the direction of polarization.

Relative dielectric constant of the piezoelectric ceramic composition of the present embodiment can be increased by increasing the additive amount of the sub-component. Therefore, it is possible to manufacture a piezoelectric substance exhibiting an excellent relative dielectric constant, and the manufactured piezoelectric substance can be used as a capacitor having large capacitance-Further, piezoelectric d-constant of the piezoelectric ceramic composition of the present embodiment can be increased in the following ways: $BiInO_3$ or $BiFeO_3$ as an sub-component is added in an amount of 0.6 mol % as in formula $\{Li_{0.04}(K_{0.48}Na_{0.52})_{0.96}\}(Nb_{0.84}Ta_{0.1}Sb_{0.06})O_3$; $BiFeO_3$ as an sub-component is added in an amount of 0.2-0.6 mol % as in formula $\{Li_{0.2}(K_{0.5}Na_{0.5})_{0.8}\}(Nb_{0.84}Ta_{0.1}Sb_{0.06})O_3$; and $BiFeO_3$ as an sub-component is added in an amount of 0.6 mol % as in formula $\{Li_{0.1}(K_{0.5}Na_{0.5})_{0.9}\}(Nb_{0.64}Ta_{0.3}Sb_{0.06})O_3$. Since the piezoelectric substance employing such a piezoelectric ceramic composition exhibits high sensitivity, it can be utilized as a piezoelectric actuator or a piezoelectric filter exhibiting high electromechanical energy conversion efficiency. Thus, the piezoelectric element, which is manufactured by employing the piezoelectric ceramic composition of the present invention, can be utilized not only as a piezoelectric element of a recording head of an inkjet system but also in apparatuses such as a memory, a capacitor, a sensor, and a light modulator.

Since leakage current of the piezoelectric ceramic composition of the present embodiment during polarization treatment is small, polarization treatment via high voltage application can be readily carried out. Then, during the polarization treatment, the polarization can be effectively carried out in a short time by applying a high voltage.

Since the sub-component further functions as a sintering additive, the sintering of the piezoelectric ceramic composition of the present embodiment can be carried out under normal atmospheric pressure, whereby the piezoelectric substance can be readily manufactured. Further, the composition on of the piezoelectric ceramic composition of the present embodiment can be readily controlled by only adding a main component mixed with a sub-component.

Further, since the piezoelectric ceramic composition contains no lead in its composition, there is no chance of leaching of the harmful lead from waste into the environment, whereby it is possible to provide a highly safe lead-free piezoelectric ceramic composition.

EXAMPLES

The manufacturing methods of the piezoelectric ceramic composition and the piezoelectric substance according to the examples of the present invention will now be detailed.

As raw materials of the piezoelectric ceramic composition, extremely pure $Li_2CO_3$, $Na_2CO_3$, $K_2CO_3$, $Nb_2O_5$, $Ta_2O_5$, and $Sb_2O_5$ at a purity of at least 99% were prepared. These raw materials were fully dried, and then compounded in such amounts that the composition was of a stoichiometric ratio of x=0.04, y=0.52, z=0.1, and w=0.06 in the aforesaid formula of $\{Li_X(K_{1-Y}Na_Y)_{1-X}\}(Nb_{1-Z-W}Ta_ZSb_W)O_3$, that is, the aforesaid formula became $\{Li_{0.04}(K_{0.48}Na_{0.52})_{0.96}\}(Nb_{0.84}Ta_{0.1}Sb_{0.06})O_3$. In addition, the dried raw materials were compounded in such amounts that the composition was of a stoichiometric ratio of x=0.2, y=0.5, z=0.1, and w=0.06 in the aforesaid formula, that is, the aforesaid formula became $\{Li_{0.2}(K_{0.5}Na_{0.5})_{0.8}\}(Nb_{0.4}Ta_{0.1}Sb_{0.06})O_3$. Further, the dried raw materials were compounded in such amounts that the composition was of a stoichiometric ratio of x=0.1, y=0.5, z=0.3, and w=0.06 in the aforesaid formula, that is, the aforesaid formula became

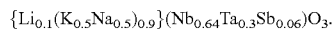
$\{Li_{0.1}(K_{0.5}Na_{0.5})_{0.9}\}(Nb_{0.64}Ta_{0.3}Sb_{0.06})O_3$.

The compounded raw materials were blended via a ball mill in anhydrous acetone over 24 hours, and then dried to produce a mixture.

Next, the aforesaid mixture was calcined at 750° C. over 5 hours, which mixture was then subjected to pulverization via a ball mill over 24 hours. The pulverized mixture was dried to produce a calcined powder of the main component.

As a sub-component, extremely pure $Bi_2O_3$, $Fe_2O_3$, $Sc_2O_3$, and $In_2O_3$ at a purity of at least 99% were prepared. These raw materials were compounded in such amounts that the composition was of a stoichiometric ratio to form the above-mentioned formula of $ABO_3$ (wherein A=Bi, B=one of Fe, Sc, and In), that is, the aforesaid formula became $BiInO_3$, $BiScO3$, or $BiFeO_3$ to produce a mixed powder of the sub-component.

The calcined powder of the main component, and $BiInO_3$ of the mixed powder of the sub-component were compounded in such amounts that the composition was of a stoichiometric ratio of v=0.002, 0.004, or 0.006 in the aforesaid formula of $(\{Li_{0.04}(K_{0.48}Na_{0.52})_{0.96}\}(Nb_{0.84}Ta_{0.1}Sb_{0.06})O_3)_{1-v}(ABO_3)_v$. With regard to each $BiScO_3$ and $BiFeO_3$ of the mixed powder of the sub-component, three compositions were prepared in the same way as in that of $BiInO_3$.

Further, in the aforesaid formula of $(\{Li_{0.2}(K_{0.5}Na_{0.5})_{0.8}\}(Nb_{0.84}Ta_{0.1}Sb_{0.06})O_3)_{1-v}(ABO_3)_v$, the main component and $BiFeO_3$ were compounded in such an amount that the composition was of a stoichiometric ratio of v=0.002, 0.004, or 0.006. Further, in the aforesaid formula of $(\{Li_{0.1}(K_{0.5}Na_{0.5})_{0.9}\}(Nb_{0.64}Ta_{0.3}Sb_{0.06})O_3)_{1-v}(ABO_3)_v$, the main component and $BiFeO_3$ were compounded in such an amount that the composition was of a stoichiometric ratio of v=0.006. Comparative examples were prepared having the aforesaid formula of $(\{Li_{0.04}(K_{0.48}Na_{0.52})_{0.96}\}(NbO_{84}Ta_{0.1}Sb_{0.06})O_3)_{1-v}(ABO_3)_v$; a sample in which no sub-component being added in the formula, and samples in which each $BiInO_3$, $BiScO_3$, and $BiFeO_3$ being compounded in such an amount that each composition having a stoichiometric ratio of v=0.01 in its formula. Further, samples were prepared having the aforesaid formula of $(\{Li_{0.2}(K_{0.5}Na_{0.5})_{0.8}\}(Nb_{0.84}Ta_{0.1}Sb_{0.06})O_3)_{1-v}(ABO_3)_v$; a sample in which no sub-component was added in the formula, and a sample in which $BiFeO_3$ was compounded in such an amount that the composition having a stoichiometric ratio of v=0.01 in the formula.

Furthermore, a sample was prepared having the aforesaid formula of $(\{Li_{0.1}(K_{0.5}Na_{0.5})_{0.9}\}(Nb_{0.64}Ta_{0.3}Sb_{0.06})O_3)_{1-v}(ABO_3)_v$ to which no sub-component was added.

As shown in Table 1, of the resulting piezoelectric ceramic compositions, a sample in which no sub-component was added in the aforesaid formula of $\{Li_{0.04}(K_{0.48}Na_{0.52})_{0.96}\}(Nb_{0.86}Ta_{0.1}Sb_{0.06})O_3$ is denoted as No. 1. Samples in which $BiInO_3$, as a sub-component, was added in the amount of 0.2, 0.4, 0.6, and 1 mol % are denoted as numbers 2, 3, 4, and 5, respectively. Similarly, samples in which BiScO3, as a sub-component, was added are denoted as numbers 6, 7, 8, and 9 in the order of added amount, and samples in which $BiFeO_3$ as a sub-component was added are denoted as numbers 10, 11, 12, and 13 in the order of added amount.

As shown in Table 2, the sample in which no sub-component was added in the aforesaid formula of $\{Li_{0.2}(K_{0.5}Na_{0.5})_{0.8}\}(Nb_{0.84}Ta_{0.1}Sb_{0.06})O_3$ is denoted as No. 14. Similarly, samples in which $BiFeO_3$, as a sub-component, was added are denoted as numbers 15, 16, 17, and 18 in the order of added amount. The sample in which no sub-component was added in the aforesaid formula of $\{Li_{0.1}(K_{0.5}Na_{0.5})_{0.9}\}(Nb_{0.64}Ta_{0.3}Sb_{0.06})O_3$ is denoted as No. 19. The sample in which $BiFeO_3$, as a sub-component, was added in an amount of 0.6 mol % is denoted as No. 20.

TABLE 1

| | Sample No. | Main Component | Molar Ratio | Sub-Component | Molar Ratio | Pr (μC/cm²) | Tc (° C.) | $d_{31}$ (pm/V) | $\epsilon_r$ | Leakage Current (μA/mm²) |
|---|---|---|---|---|---|---|---|---|---|---|
| Comp. | 1 | $\{Li_X(K_{1-y}Na_y)_{1-x}\}$ | 1 | Not Added | 0 | 4 | 284 | 105 | 1411 | 6.72 |
| Inv. | 2 | $(Nb_{1-z-w}Ta_zSb_w)O_3$ | 0.998 | $BiInO_3$ | 0.002 | 7.8 | 276 | 85.3 | 1493 | 2.34 |
| Inv. | 3 | (x = 0.04, y = 0.52, | 0.996 | | 0.004 | 12.1 | 268 | 93.4 | 1469 | 0.67 |
| Inv. | 4 | z = 0.1, w = 0.06) | 0.994 | | 0.006 | 7.5 | 254 | 113 | 1523 | 0.31 |
| Comp. | 5 | | 0.99 | | 0.01 | No Highly Dense Sintered Substance Provided | | | | |
| Inv. | 6 | | 0.998 | $BiScO_3$ | 0.002 | 13.7 | 272 | 106 | 1623 | 1.21 |
| Inv. | 7 | | 0.996 | | 0.004 | 8.5 | 264 | 107.6 | 1665 | 0.36 |
| Inv. | 8 | | 0.994 | | 0.006 | 8.7 | 258 | 102 | 1702 | 0.27 |
| Comp. | 9 | | 0.99 | | 0.01 | No Highly Dense Sintered Substance Provided | | | | |
| Inv. | 10 | | 0.998 | $BiFeO_3$ | 0.002 | 31.7 | 278 | 105 | 1579 | 0.95 |
| Inv. | 11 | | 0.996 | | 0.004 | 18.1 | 264 | 113 | 1700 | 0.12 |
| Inv. | 12 | | 0.994 | | 0.006 | 18.5 | 260 | 113 | 1798 | 0.03 |
| Comp. | 13 | | 0.99 | | 0.01 | No Highly Dense Sintered Substance Provided | | | | |

Comp.: Comparative Example, Inv.: Present Invention

TABLE 2

| Sample No. | Main Component | Molar Ratio | Sub-Component | Molar Ratio | Pr ($\mu$C/cm$^2$) | Tc (° C.) | $d_{31}$ (pm/V) | $\epsilon_r$ | Leakage Current ($\mu$A/mm$^2$) |
|---|---|---|---|---|---|---|---|---|---|
| Comp. 14 | $\{Li_x(K_{1-y}Na_y)_{1-x}\}$ | 1 | Not Added | 0 | 12.8 | 316 | 67 | 1096 | 4.30 |
| Inv. 15 | $(Nb_{1-z-w}Ta_zSb_w)O_3$ | 0.998 | BiFeO$_3$ | 0.002 | 16.5 | 308 | 87 | 1280 | 0.14 |
| Inv. 16 | (x = 0.2, y = 0.5, | 0.996 | | 0.004 | 17.9 | 298 | 100 | 1804 | 0.45 |
| Inv. 17 | z = 0.1, w = 0.06) | 0.994 | | 0.006 | 10.9 | 292 | 68 | 1436 | 0.25 |
| Comp. 18 | | 0.99 | | 0.01 | 2.8 | 277 | 43 | 580 | 0.35 |
| Comp. 19 | $\{Li_x(K_{1-y}Na_y)_{1-x}\}$ $(Nb_{1-z-w}Ta_zSb_w)O_3$ | 1 | Not Added | 0 | 6.6 | 323 | 74 | 1057 | 9.81 |
| Inv. 20 | (x = 0.1, y = 0.5, z = 0.3, w = 0.06) | 0.994 | BiFeO$_3$ | 0.006 | 12.4 | 308 | 87 | 1319 | 0.71 |

Comp.: Comparative Example, Inv.: Present Invention

A composition in which each component was compounded was mixed via a ball mill in anhydrous acetone over 24 hours, and then dried to produce a mixture.

Next, the aforesaid mixture was calcined at 700-800° C. over 5 hours, which was then subjected to pulverization via a ball mill over 24 hours. Subsequently, polyvinyl butyral as a binder was added thereto, and then the mixture was granulated and subjected to pressure molding. The pressure molding was carried out in such a manner that the granulated substance, made of the pulverized substance, was molded in the form of pellets via uniaxial pressing, and then the resultant pellets were re-molded via a cold isostatic press (CIP) at a pressure of 1 ton/cm$^2$.

The compact thus produced were sintered at 1,000-1,300° C. over one hour to produce a sintering product. The temperature, at which the highest density thereof was yielded, was selected from temperature between 1,000-1,300° C. as the sintering temperature. A highly dense sintered substance was not provided from a mixture exhibiting the aforesaid formula of $\{Li_{0.04}(K_{0.48}Na_{0.52})_{0.96}\}(Nb_{0.84}Ta_{0.1}Sb_{0.06})O_3$ to which the amount of the sub-component added was 1 mol %.

The obtained calcination product was cut to a predetermined size, which was then subjected to parallel grinding to reach about 0.5 mm in thickness, followed by formation of gold electrodes via sputtering on both sides thereof. Subsequently, direct current voltage of 1-6 kV/mm was applied between the electrodes to be polarized in the thickness direction to produce a piezoelectric substance.

Subsequently, a piezoelectric $d_{31}$ constant, Curie temperature Tc, relative dielectric constant $\epsilon_r$, and the P-E hysteresis characteristics were determined on Sample numbers 1-20. The piezoelectric $d_{31}$ constant was determined via a resonance-anti-resonance method employing an impedance analyzer (type 4294A: manufactured by Agilent Technologies Inc.). Relative dielectric constant $\epsilon_r$ was determined employing an impedance analyzer (type 4294A: manufactured by Agilent Technologies Inc.) at a measuring frequency of 100 kHz. Curie temperature Tc was taken as a temperature at which the relative dielectric constant 8, exhibited its highest value. The P-E hysteresis characteristics were determined at room temperature via the Evaluation System of Characteristics of Ferroelectric Substance (a product of Agilent Technologies Inc.). The results of which are shown in Tables 1 and 2.

The P-E hysteresis characteristics were determined for Sample numbers 1 and 12 by applying voltages of 1, 2, 3, 4, and 5 kV. The results are shown in FIG. 1. As seen from FIG. 1, addition of a sub-component, as was applied to the piezoelectric ceramic composition of the present embodiments, provides good square-shaped hysteresis loops, leading to a preferred large remanent polarization (Pr)($\mu$C/cm$^2$). The term "remanent polarization" refers to a magnitude of polarization when the electric field is reversed, that is, when applied electric field intensity becomes 0 kV/cm. In FIG. 1, "remanent polarization" corresponds to an amount of polarization at an intersection point of the hysteresis loop with the Y axis (the line at 0 kV/cm of the electrical field intensity).

Further, the leakage current at 3 kV/mm of applied electric field was determined for Sample numbers 1-20 during the polarization treatment. The results are shown in Tables 1 and 2.

As shown in Tables 1 and 2, the piezoelectric substances manufactured from the piezoelectric ceramic compositions of the present invention exhibit significantly little leakage current during the polarization treatment, resulting in efficient polarization treatment.

Further, the crystalline phase of the resulted sintered substance was identified via powdered XRD analysis. The generation of a solid solution in the sintered substance composed of the piezoelectric ceramic composition of the present invention was confirmed from the fact that the diffraction peak was indicative of single-phase structure of a perovskite and successively shifted with the increase of the amount of the sub-component.

In the present examples, main components of formulae of $\{Li_{0.04}(K_{0.48}Na_{0.52})_{0.96}\}(Nb_{0.84}Ta_{0.1}Sb_{0.06})O_3$, $\{Li_{0.2}(K_{0.5}Na_{0.5})_{0.8}\}(Nb_{0.84}Ta_{0.1}Sb_{0.06})O_3$, and $\{Li_{0.1}(K_{0.5}Na_{0.5})_{0.8}\}(Nb_{0.84}Ta_{0.3}Sb_{0.3}Sb_{0.06})O_3$ were employed, but any appropriate main components can be employed, and will provide the similar effects as long as they are of a formula of $\{Li_X(K_{1-Y}Na_Y)_{1-X}\}(Nb_{1-Z-W}Ta_ZSb_W)O_3$, wherein x, y, z and w are within the ranges of $0 \leq x \leq 0.2$, $0 < y \leq 1$, $0 < z \leq 0.4$, and $0 < w \leq 0.2$ respectively.

In the present examples, a sub-component was added as a form of mixed powder, but addition of a sub-component as calcined powders which was produced in advance by calcined the raw materials for the sub-component, also provides similar effects.

What is claimed is:

1. A piezoelectric ceramic composition comprising a primary ingredient represented by Formula 1 and an auxiliary ingredient represented by Formula 2,

$[Li_X(K_{1-Y}Na_Y)_{1-X}]_a[(Nb_{1-Z-W}Ta_ZSb_W)]_bO_3$,     Formula 1 wherein $0 \leq X \leq 0.2$, $0 \leq Y \leq 1$, $0 < Z \leq 0.4$, and $0 < W \leq 0.2$, $0.95 \leq a \leq 1.05$, $0.95 \leq b \leq 1.05$, Formula 2: BiFeO$_3$, wherein BiFeO$_3$ represents a compound having a perovskite structure; and
   the amount of an auxiliary ingredient is less than 1 Mol % per 100 mol % of a piezoelectric ceramic composition after an auxiliary ingredient has been added.

2. The piezoelectric ceramic composition of claim 1, having a remanent polarization of 10.9 or more.

* * * * *